United States Patent
Hong

(10) Patent No.: US 10,304,548 B2
(45) Date of Patent: May 28, 2019

(54) SEMICONDUCTOR MEMORY DEVICE AND METHOD OF OPERATING THE SAME

(71) Applicant: SK hynix Inc., Icheon (KR)

(72) Inventor: Ji Man Hong, Seongnam (KR)

(73) Assignee: SK HYNIX INC., Icheon (KR)

( * ) Notice: Subject to any disclaimer, the term of this patent is extended or adjusted under 35 U.S.C. 154(b) by 0 days.

(21) Appl. No.: 15/860,539

(22) Filed: Jan. 2, 2018

(65) Prior Publication Data

US 2019/0080775 A1 Mar. 14, 2019

(30) Foreign Application Priority Data

Sep. 11, 2017 (KR) .......................... 10-2017-0115987

(51) Int. Cl.
| | |
|---|---|
| *G11C 16/04* | (2006.01) |
| *G11C 16/34* | (2006.01) |
| *G11C 16/08* | (2006.01) |
| *G11C 16/26* | (2006.01) |

(52) U.S. Cl.
CPC ...... *G11C 16/3413* (2013.01); *G11C 16/0483* (2013.01); *G11C 16/08* (2013.01); *G11C 16/26* (2013.01)

(58) Field of Classification Search
CPC . G11C 16/3413; G11C 16/0483; G11C 16/08; G11C 16/26
See application file for complete search history.

(56) References Cited

U.S. PATENT DOCUMENTS

| | | | | |
|---|---|---|---|---|
| 9,171,635 | B2 * | 10/2015 | Mun ................... | G11C 16/3459 |
| 9,953,700 | B2 * | 4/2018 | Kim ...................... | G11C 11/418 |
| 2017/0277454 | A1 * | 9/2017 | Shin ....................... | G06F 3/0619 |

FOREIGN PATENT DOCUMENTS

| | | |
|---|---|---|
| KR | 10-2013-0045495 A | 5/2013 |
| KR | 10-1406279 B1 | 6/2014 |
| KR | 10-1576991 B1 | 12/2015 |
| KR | 10-2017-0011641 A | 2/2017 |

* cited by examiner

*Primary Examiner* — Pho M Luu

(57) ABSTRACT

A semiconductor memory device and a method of operating the same are provided. The method of operating the semiconductor memory device includes determining a target word line coupled to an over-programmed memory cell, backing up data stored in memory cells coupled to the target word line in a second memory area, wherein the se second memory area is different from a first memory area where the memory cells coupled to the target word line are disposed, and applying a stepped-up read pass voltage to the target word line when a read operation is performed on a selected memory cell in a memory block coupled to the target word line, wherein the selected memory cell is different from the over-programmed memory cell. Therefore, the operation reliability of the semiconductor memory device is improved.

20 Claims, 11 Drawing Sheets

SEMICONDUCTOR MEMORY DEVICE AND METHOD OF OPERATING THE SAME

CROSS-REFERENCE TO RELATED APPLICATION

The present application claims priority under 35 U.S.C. § 119(a) to Korean patent application number 10-2017-0115987 filed on Sep. 11, 2017, the entire disclosure of which is incorporated herein by reference.

BACKGROUND

Field of Invention

Various embodiments of the present disclosure relate to a storage device, and more particularly, to a semiconductor memory device and a method of operating the semiconductor memory device.

Description of Related Art

A memory device may have a two-dimensional (2D) structure in which cell strings are horizontally arranged on a semiconductor substrate, or a three-dimensional (3D) structure in which cell strings are vertically arranged on a semiconductor substrate. A memory device having a 3D structure (referred to as a "3D memory device") is devised to overcome a limitation in the degree of integration of a memory device having a 2D structure (referred to as a "2D memory device"). The 3D memory device may include a plurality of memory cells included in a plurality of cell strings that are vertically stacked on a semiconductor substrate.

SUMMARY

Various embodiments of the present disclosure are directed to a semiconductor memory device, which has enhanced reliability.

Various embodiments of the present disclosure are directed to a method of operating a semiconductor memory device, which has enhanced reliability.

An embodiment of the present disclosure may provide for a method of operating a semiconductor memory device. The method of operating the semiconductor memory device may include determining a target word line coupled to an over-programmed memory cell, backing up data stored in memory cells coupled to the target word line in a second memory area, wherein the se second memory area is different from a first memory area where the memory cells coupled to the target word line are disposed, and applying a stepped-up read pass voltage to the target word line when a read operation is performed on a selected memory cell in a memory block coupled to the target word line, wherein the selected memory cell is different from the over-programmed memory cell.

In an embodiment, the stepped-up read pass voltage has a higher level than a read pass voltage, the read pass voltage may be applied to an unselected memory cell in the read operation, and the unselected memory cell may be not over-programmed.

In an embodiment, the over-programmed cell may be turned on when the stepped-up read pass voltage is applied to the over-programmed cell.

In an embodiment, the selected memory cell may be located in a memory cell string that includes a plurality of memory cells connected in series. In addition, the plurality of memory cells may be coupled to a plurality of word lines, respectively.

In an embodiment, determining the target word line may include detecting the over-programmed memory cell.

The method may further include, after backing up the data stored in the memory cells coupled to the target word line in the second memory area, invalidating the data stored in the memory cells coupled to the target word line.

In an embodiment, when memory cells in the second memory area store the backed-up data, invalidating the data may include updating physical addresses corresponding to the memory cells coupled to the target word line with physical addresses corresponding to the memory cells in the second memory area. In this case, when the data stored in the memory cells coupled to the target word line is read, the backed-up data may be read.

In an embodiment, the method may further include, after backing up the data stored in the memory cells coupled to the target word line in the second memory area, stepping up a read voltage. In this case the read voltage may be applied to the target word line when the data stored in the memory cells coupled to the target word line is read.

In an embodiment, when, as a result of the read operation on the data stored in the memory cells coupled to the target word line, a read failure occurs, the method may further include additionally stepping up the read voltage that has been stepped up to perform the read operation.

In an embodiment, as a result of the read operation on the data stored in the memory cells coupled to the target word line, a read failure occurs, the data stored in the memory cells coupled to the target word line may be invalidated, and the data backed up to the second memory area may be read.

In an embodiment, the second memory area may be located in a memory block that is different from the memory block to which the target word line is coupled.

An embodiment of the present disclosure may provide for a semiconductor memory device. The semiconductor memory device may include a memory cell array including a plurality of memory cells, a peripheral circuit configured to perform a data program operation, a data read operation, and a data erase operation on the memory cell array, and a control logic configured to control the peripheral circuit such that the data program operation, the data read operation, and the data erase operation on the memory cell array are performed. When an over-programmed memory cell is present in the memory cell array, the control logic may be configured to back up data stored in a target page, which corresponds to a target word line to which the over-programmed memory cell is coupled, in a second memory area in the memory cell array. The second memory area may be different from a first memory area where memory cells corresponding to the target page are disposed. Further, the control logic may control the peripheral circuit such that a stepped-up read pass voltage is applied to the target word line when a read operation is performed on a selected memory cell in a memory block coupled to the target word line. The selected memory cell may be different from the over-programmed memory cell.

In an embodiment, the control logic may be further configured to, when a read operation is performed on the data stored in the target page, control the peripheral circuit such that the backed-up data stored in the second memory area is read.

In an embodiment, the control logic may be further configured to, when a read operation is performed on the data stored in the target page, control the peripheral circuit such that a stepped-up read voltage is applied to the target word line. The stepped-up read voltage may have a higher level than a read voltage.

In an embodiment, the control logic may be further configured to, when a read failure occurs in the data stored in the target page, control the peripheral circuit such that the stepped-up read voltage is further stepped up and then the read operation is performed again.

In an embodiment, the control logic may be further configured to, when a read failure occurs in the data stored in the target page, control the peripheral circuit such that the backed-up data stored in the second memory is read.

In an embodiment, the second memory area may be located in a memory block that is different from the memory block to which the target word line is coupled.

DETAILED DESCRIPTION

Figure 1:
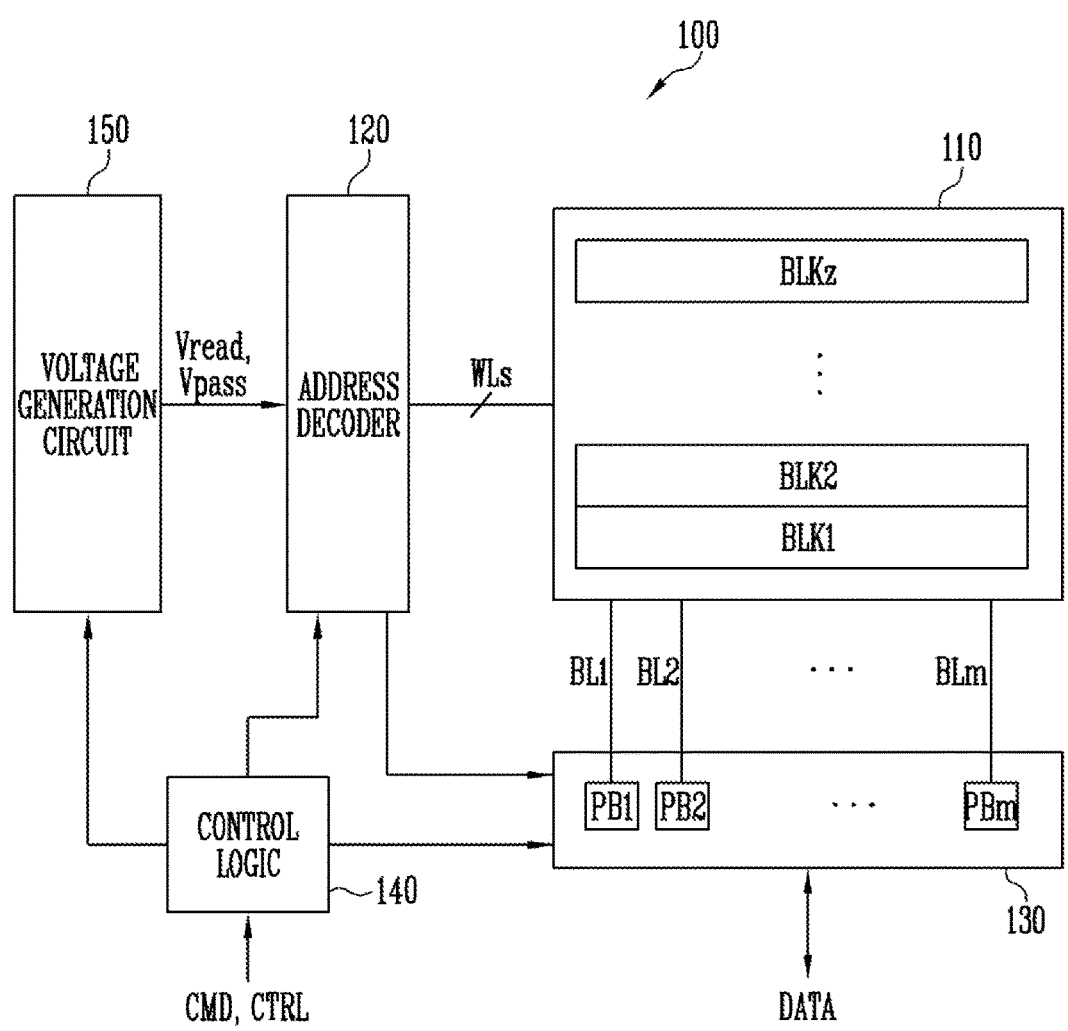
FIG. 1 is a block diagram illustrating a semiconductor memory device according to an embodiment of the present disclosure.

Advantages and features of the present disclosure, and methods for achieving the same will be cleared with reference to exemplary embodiments described later in detail together with the accompanying drawings. Accordingly, the present disclosure is not limited to the following embodiments but embodied in other forms. Rather, these embodiments are provided so that the present disclosure will be thorough and complete, and will fully convey the technical spirit of the disclosure to those skilled in the art.

It will be understood that when an element is referred to as being "coupled" or "connected" to another element, it can be directly coupled or connected to the other element or intervening elements may be present therebetween. In the specification, when an element is referred to as "comprising" or "including" a component, it does not preclude another component but may further include other components unless the context clearly indicates otherwise.

Hereinafter, embodiments in accordance with the present disclosure will be described in detail with reference to the accompanying drawings. Reference now should be made to the drawings, in which the same reference numerals are used throughout the different drawings to designate the same or similar components. Details of well-known configurations and functions may be omitted to avoid unnecessarily obscuring the gist of the present disclosure.

FIG. 1 is a block diagram illustrating a semiconductor memory device 100 according to an embodiment of the present disclosure.

Referring to FIG. 1, the semiconductor memory device 100 includes a memory cell array 110, an address decoder 120, a read and write circuit 130, a control logic 140, and a voltage generation circuit 150.

The memory cell array 110 includes a plurality of memory blocks BLK1 to BLKz, z being a positive integer. The memory blocks BLK1 to BLKz may be coupled to the address decoder 120 through word lines WLs. The memory blocks BLK1 to BLKz are coupled to the read and write circuit 130 through bit lines BL1 to BLm, m being a positive integer. Each of the memory blocks BLK1 to BLKz includes a plurality of memory cells. In an embodiment, the plurality of memory cells may be nonvolatile memory cells, and may be implemented with nonvolatile memory cells having a vertical channel structure. The memory cell array 110 may be implemented with a memory cell array having a two-dimensional (2D) structure. In an embodiment, the memory cell array 110 may be implemented with a memory cell array having a three-dimensional (3D) structure.

Each of the memory cells included in the memory cell array 110 may store at least one bit of data. In an embodiment, each of the memory cells included in the memory cell array 110 may be a single-level cell (SLC), which stores 1-bit data. In another embodiment, each of the memory cells included in the memory cell array 110 may be a multi-level cell (MLC), which stores 2-bit data. In still another embodiment, each of the memory cells included in the memory cell array 110 may be a triple-level cell, which stores 3-bit data. In further still another embodiment, each of the memory cells included in the memory cell array 110 may be a quad-level cell, which stores 4-bit data. In various embodiments, the memory cell array 110 may include a plurality of memory cells, each of which stores 5 or more bits of data.

The address decoder 120, the read and write circuit 130, the control logic 140, and the voltage generation circuit 150 operate as a peripheral circuit for driving the memory cell array 110. The address decoder 120 is coupled to the memory cell array 110 through the word lines WLs. The address decoder 120 may operate under the control of the control logic 140. The address decoder 120 may receive addresses from an external device through an input/output buffer (not illustrated) of the semiconductor memory device 100.

The address decoder 120 may decode a block address among the received addresses. The address decoder 120 selects at least one of the memory blocks BLK1 to BLKz based on the decoded block address. When a read voltage application operation is performed during a read operation, the address decoder 120 may apply a read voltage Vread, which is generated by the voltage generation circuit 150, to a selected word line connected to the selected memory block, and may apply a pass voltage Vpass to the remaining unselected word lines among the word lines WLs. During a program verify operation, the address decoder 120 may apply a verify voltage, generated by the voltage generation circuit 150, to the selected word line connected to the selected memory block, and may apply the pass voltage Vpass to the remaining unselected word lines.

The address decoder 120 may decode a column address among the received addresses. The address decoder 120 may transmit the decoded column address to the read and write circuit 130.

The read and program verify operations of the semiconductor memory device 100 are each performed on a page basis. Addresses received to perform the read and program verify operations may include a block address, a row address, and a column address. The address decoder 120 may select one memory block and one word line in accordance with the block address and the row address. The column address may be decoded by the address decoder 120, and may then be provided to the read and write circuit 130 to select one of the bit lines BL1 to BLm.

The address decoder 120 may include a block decoder, a row decoder, a column decoder, an address buffer, etc.

The read and write circuit 130 includes a plurality of page buffers (or page registers) PB1 to PBm. The read and write circuit 130 may operate as a "read circuit" during the read operation of the memory cell array 110 and as a "write circuit" during a write (or program) operation of the memory cell array 110. The plurality of page buffers PB1 to PBm are coupled to the memory cell array 110 through the bit lines BL1 to BLm, respectively. During the read or program verify operation, in order to sense threshold voltages of the memory cells, the page buffers PB1 to PBm may supply a sensing current to the bit lines BL1 to BLm coupled to the memory cells. While the sensing current is supplied, each of the page buffers PB1 to PBm senses, through a sensing node, a change in an amount of current flowing through a corresponding one of the bit lines BL1 to BLm depending on a program state of a corresponding memory cell, and latches the current change as sensing data. The read and write circuit 130 operates in response to page buffer control signals provided by the control logic 140.

During the read operation, the read and write circuit 130 may sense data stored in the memory cells and temporarily store read data, and may then output the stored read data to the input/output buffer (not shown) of the semiconductor memory device 100. In an embodiment, the read and write circuit 130 may include a column selection circuit or the like as well as the page buffers PB1 to PBm.

The control logic 140 is coupled to the address decoder 120, the read and write circuit 130, and the voltage generation circuit 150. The control logic 140 may receive a command CMD and a control signal CTRL from an external device through the input/output buffer (not shown) of the semiconductor memory device 100. The control logic 140 may control the overall operation of the semiconductor memory device 100 in response to the command CMD and the control signal CTRL. The control logic 140 may output a precharge control signal for controlling a precharge potential level at sensing nodes of the plurality of page buffers PB1 to PBm. The control logic 140 may control the read and write circuit 130 to perform the read operation of the memory cell array 110.

In accordance with an embodiment of the present disclosure, when an over-programmed memory cell is present in the memory cell array 110, the control logic 140 may control the peripheral circuit so that data stored in a page corresponding to a target word line to which the over-programmed memory cell is coupled is backed up to memory cells disposed in an additional memory area in the memory cell array 110. Further, the control logic 140 may control the peripheral circuit so that, when the read operation is performed on a memory block coupled to the target word line, a stepped-up read pass voltage is applied to the target word line. Accordingly, the operation stability of the semiconductor memory device 100 may be improved. The data back-up operation and the application of the stepped-up read pass voltage will be described in detail later with reference to FIGS. 7 to 11.

Figure 5:
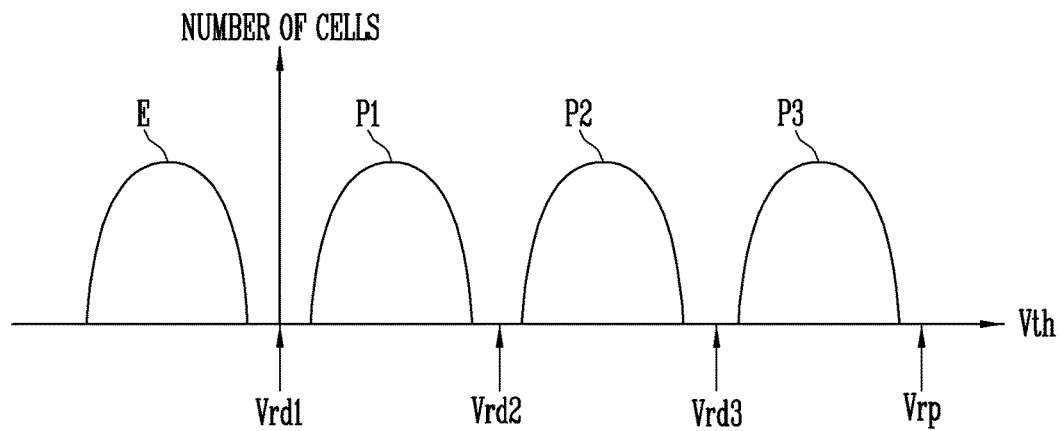
FIG. 5 illustrates a threshold voltage distribution depending on a program state of a multi-level cell.
Figure 9:
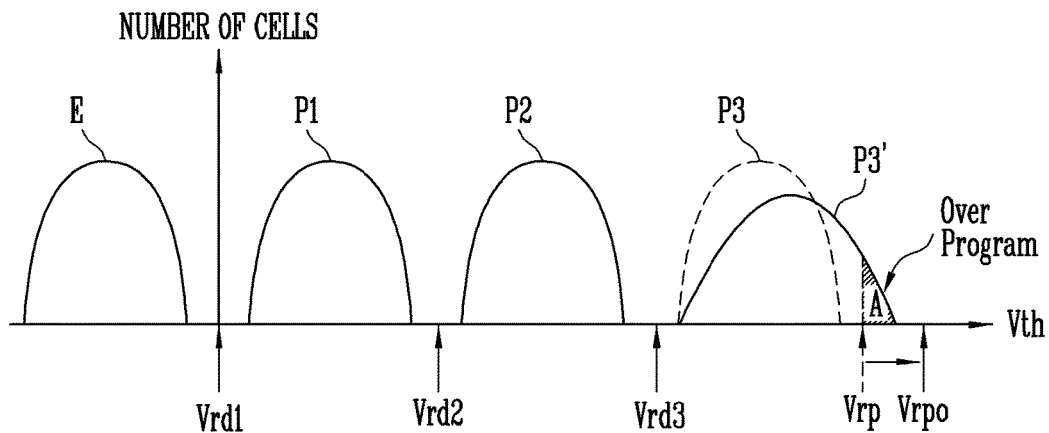
FIG. 9 describes an effect obtained by applying a stepped-up read pass voltage to an over-programmed memory cell.
Figure 13:
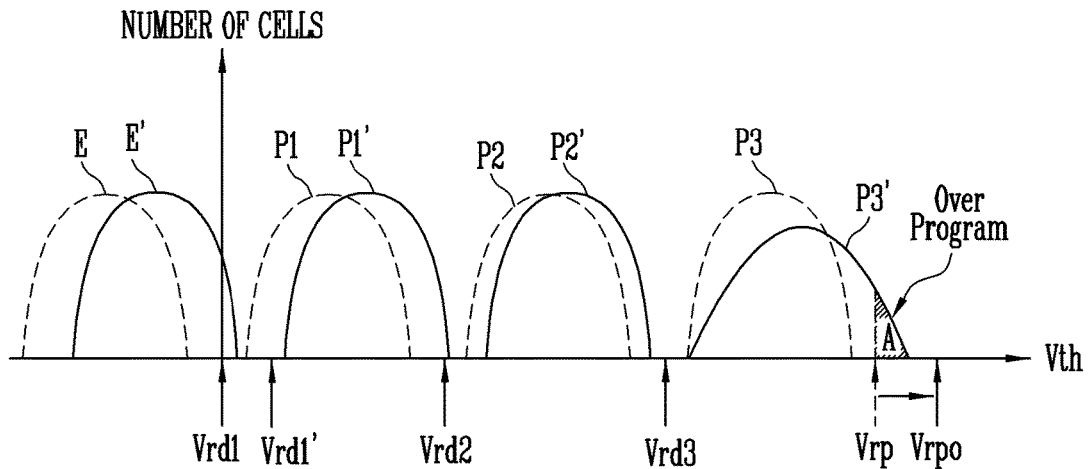
FIG. 13 illustrates stepping up a read voltage that is to be applied to a target word line according to an embodiment of the present disclosure.

The voltage generation circuit 150 may generate the read voltage Vread and the pass voltage Vpass required for performing the read operation in response to a control signal provided by the control logic 140. The read voltage Vread may include first, second, and third read voltages Vrd1, Vrd2, and Vrd3, as illustrated in FIG. 5. Further, the read voltage Vread may include a stepped-up first read voltage Vrd1', as illustrated in FIG. 13. Meanwhile, the pass voltage Vpass may include a read pass voltage Vrp and a stepped-up read pass voltage Vrpo, as illustrated in FIG. 9.

Figure 2:
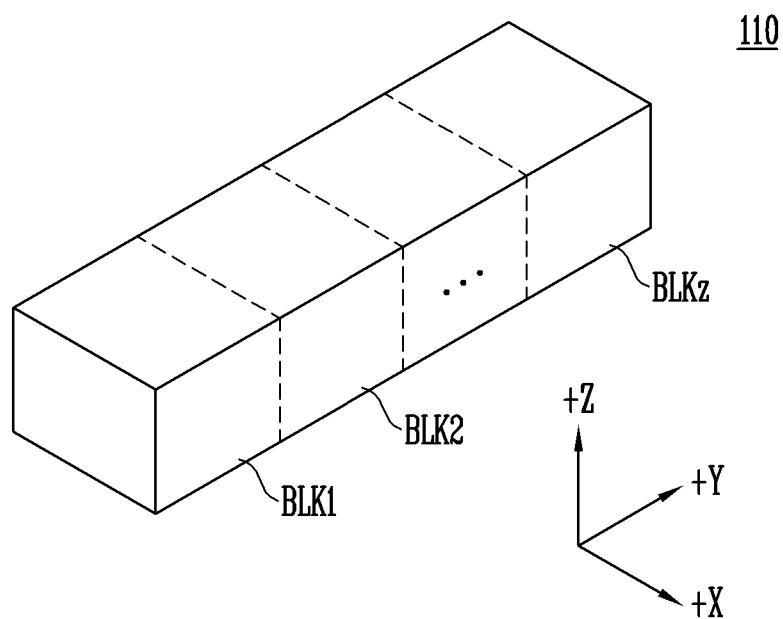
FIG. 2 is a block diagram illustrating a memory cell array of FIG. 1 according to an embodiment of the present disclosure.

FIG. 2 is a block diagram illustrating the memory cell array of FIG. 1 according to an embodiment.

Referring to FIG. 2, the memory cell array 110 according to this embodiment includes a plurality of memory blocks BLK1 to BLKz. Each of the memory blocks BLK1 to BLKz may have a three-dimensional (3D) structure. Each of the memory blocks BLK1 to BLKz may include a plurality of memory cells stacked on a substrate. The memory cells are arranged in +X, +Y, and +Z directions. A structure of each memory block configured in the 3D structure will be described in detail later with reference to FIGS. 3 and 4. Meanwhile, unlike the structure illustrated in FIG. 2, each memory block of the memory cell array 110 may have a 2D structure.

Figure 3:
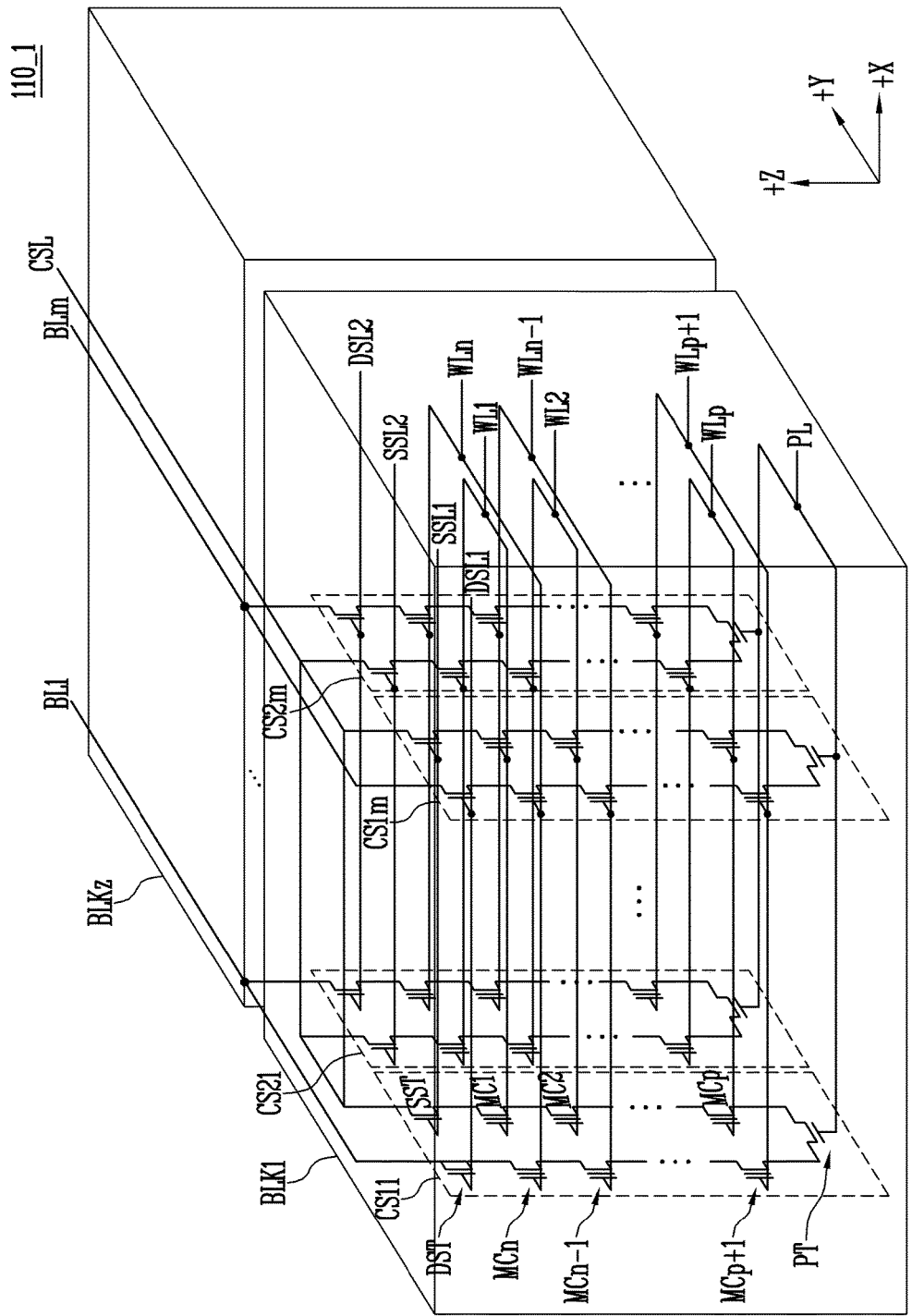
FIG. 3 illustrates the memory cell array of FIG. 1 according to an embodiment of the present disclosure.

FIG. 3 illustrates the memory cell array of FIG. 1 according to an embodiment.

Referring to FIG. 3, a memory cell array 110_1 according to this embodiment includes a plurality of memory blocks BLK1 to BLKz that are configured in a 3D structure. For the convenience of description, FIG. 3 illustrates an internal configuration of the first memory block BLK1, only, and internal configurations of the remaining memory blocks BLK2 to BLKz are omitted. However, it will be understood that the second to z-th memory blocks BLK2 to BLKz each have substantially the same configuration as the first memory block BLK1.

Referring to FIG. 3, the first memory block BLK1 includes a plurality of cell strings, e.g., CS11 to CS1*m* and CS21 to CS2*m*. In an embodiment, each of the cell strings CS11 to CS1*m* and CS21 to CS2*m* may be formed in a 'U' shape. In the first memory block BLK1, m cell strings are arranged in a row direction (e.g., a positive (+) X direction). In FIG. 3, two cell strings are arranged in a column direction (e.g., a positive (+) Y direction). However, this configuration is made for convenience of description, and it will be understood that three or more cell strings may be arranged in the column direction. In the present disclosure the cell string may be referred to as a "memory cell string."

Each of the plurality of cell strings CS11 to CS1m and CS21 to CS2m includes at least one source select transistor SST, first to n-th memory cells MC1 to MCn (n being a positive integer), a pipe transistor PT, and at least one drain select transistor DST.

The select transistors SST and DST and the memory cells MC1 to MCn may have similar structures to each other. In an embodiment, each of the select transistors SST and DST and the memory cells MC1 to MCn may include a channel layer, a tunneling insulating layer, a charge storage layer, and a blocking insulating layer. In an embodiment, a pillar for providing the channel layer may be provided in each cell string. In an embodiment, a pillar for providing at least one of the channel layer, the tunneling insulating layer, the charge storage layer, and the blocking insulating layer may be provided in each cell string.

The source select transistor SST in each cell string is connected between a common source line CSL and a cell group of the memory cells MC1 to MCp (p being bigger than 1 and smaller than n, e.g., n/2). In FIG. 3, the source select transistor SST is directly connected to the common source line CSL and the memory cell MC1.

In an embodiment, gate electrodes of source select transistors SSTs of cell strings arranged in the same row are coupled to a same source select line SSL extending in a row direction corresponding to the +X direction, and gate electrodes of source select transistors SSTs of cell strings arranged in different rows are coupled to different source select lines extending in the row direction. In FIG. 3, gate electrodes of the source select transistors SSTs of the cell strings CS11 to CS1m in a first row are coupled to a first source select line SSL1. Gate electrodes of the source select transistors SSTs of the cell strings CS21 to CS2m in a second row are coupled to a second source select line SSL2.

In another embodiment, the gate electrodes of the source select transistors SSTs of the cell strings CS11 to CS1m and CS21 to CS2m in the first and second rows may be coupled in common to a single source select line SSL. That is, gate electrodes of source select transistors SSTs of cell strings in two adjacent rows are coupled to a single common source select line. In other embodiments, gate electrodes of source select transistors SSTs of cell strings in more than two adjacent rows are coupled to a single common source select line.

The first to n-th memory cells MC1 to MCn in each cell string are coupled between the source select transistor SST and the drain select transistor DST.

The first to n-th memory cells MC1 to MCn may be divided into the first to p-th memory cells MC1 to MCp, and the (p+1)-th to n-th memory cells MCp+1 to MCn by the pipe transistor PT. The first to p-th memory cells MC1 to MCp are sequentially arranged in a direction opposite to a positive (+) Z direction and are connected in series between the source select transistor SST and the pipe transistor PT. The (p+1)-th to n-th memory cells MCp+1 to MCn are sequentially arranged in the +Z direction and are connected in series between the pipe transistor PT and the drain select transistor DST. The first to p-th memory cells MC1 to MCp and the (p+1)-th to n-th memory cells MCp+1 to MCn are coupled to each other through the pipe transistor PT. Gate electrodes of the first to n-th memory cells MC1 to MCn in each cell string are coupled to first to n-th word lines WL1 to WLn, respectively.

A gate electrode of the pipe transistor PT in each cell string is coupled to a pipeline PL.

The drain select transistor DST in each cell string is connected between a corresponding bit line and a cell group of the memory cells MCp+1 to MCn. Drain select transistors of cell strings in the same row are coupled to a corresponding one of drain select lines DSLs extending in the row direction. Therefore, gate electrodes of the drain select transistors DSTs of the cell strings CS11 to CS1m in the first row are coupled to a first drain select line DSL1. Gate electrodes of the drain select transistors DSTs of the cell strings CS21 to CS2m in the second row are coupled to a second drain select line DSL2.

Cell strings arranged in the column direction corresponding to the +Y direction are coupled in common to a corresponding one of bit lines extending in the column direction. In FIG. 3, the cell strings CS11 and CS21 in a first column are coupled to a first bit line BL1. The cell strings CS1m and CS2m in an m-th column are coupled to an m-th bit line BLm.

Memory cells coupled to the same word line in cell strings arranged in the row direction constitute a single page. For example, the memory cells MC1s coupled to the first word line WL1, in the cell strings CS11 to CS1m in the first row, constitute a single page. The memory cells MC1s coupled to the first word line WL1, in the cell strings CS21 to CS2m in the second row, constitute another single page. That is, memory cells, which are arranged in the +X direction and are coupled to the same word line, constitute a single page. Referring to FIG. 3, cell strings arranged in a single row, e.g., the cell strings CS11 to CS1m or the cell strings CS21 or CS2m, may be selected by a corresponding one of the drain select lines DSL1 and DSL2. A single page may be selected from the selected cell strings arranged in the selected single row by selecting any one of the word lines WL1 to WLn.

Figure 4:
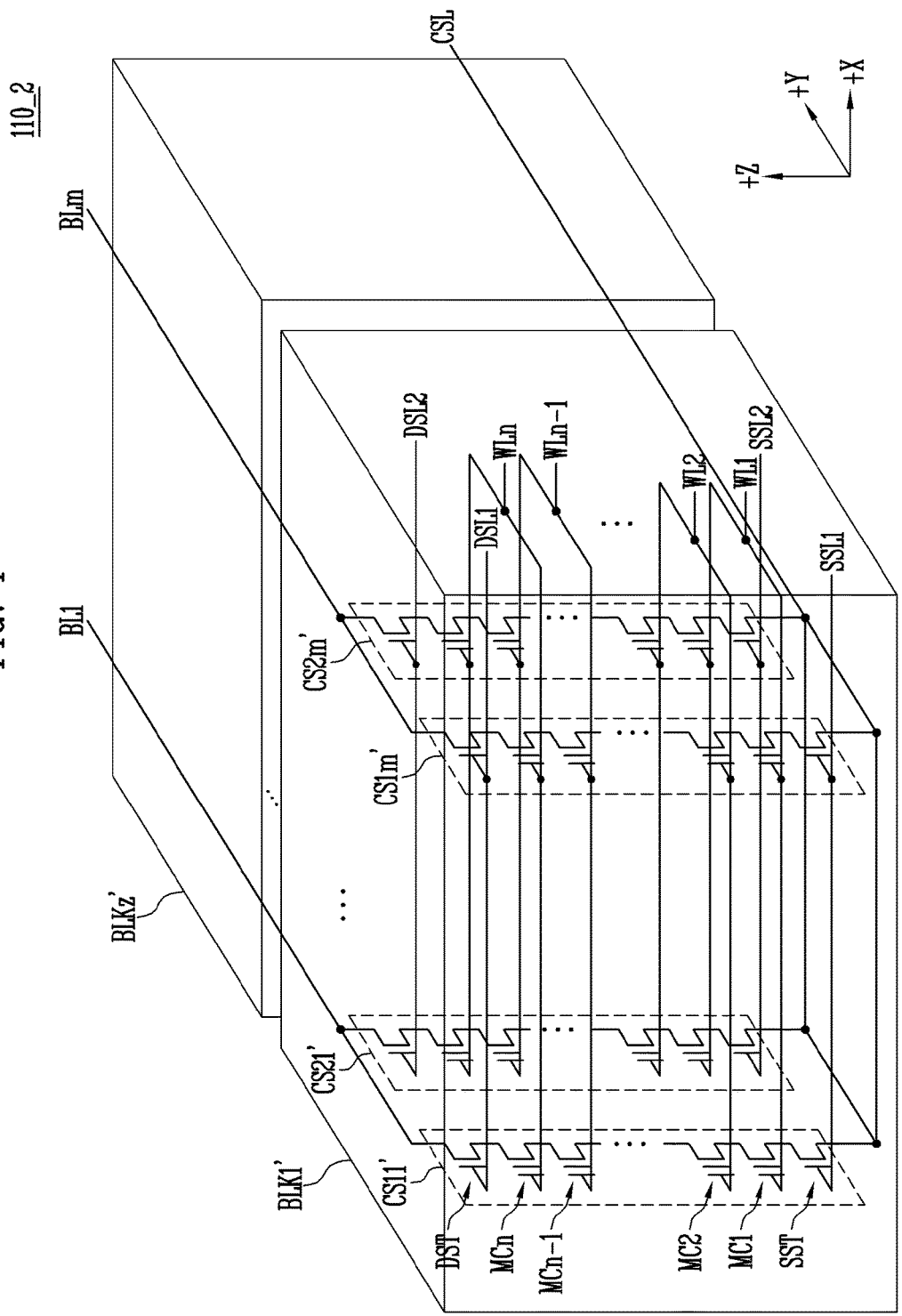
FIG. 4 illustrates the memory cell array of FIG. 1 according to another embodiment of the present disclosure.

FIG. 4 illustrates the memory cell array of FIG. 1 according to another embodiment.

Referring to FIG. 4, a memory cell array 110_2 according to this embodiment includes a plurality of memory blocks BLK1' to BLKz'. For the convenience of description, FIG. 4 illustrates an internal configuration of the first memory block BLK1', only, and internal configurations of the remaining memory blocks BLK2' to BLKz' are omitted. However, it will be understood that the second to z-th memory blocks BLK2' to BLKz' have substantially the same configuration as the first memory block BLK1'.

The first memory block BLK1' includes a plurality of cell strings, e.g., CS11' to CS1m' and CS21' to CS2m'. Each of the plurality of cell strings CS11' to CS1m' and CS21' to CS2m' extends along a +Z direction. In the first memory block BLK1', m cell strings are arranged in a row direction (e.g., +X direction). In FIG. 4, two cell strings are arranged in a column direction (e.g., a +Y direction). However, this configuration is made for the convenience of description, and it will be understood that three or more cell strings may be arranged in the column direction.

Each of the cell strings CS11' to CS1m' and CS21' to CS2m' includes at least one source select transistor SST, first to n-th memory cells MC1 to MCn, and at least one drain select transistor DST.

The source select transistor SST in each cell string is connected between a common source line CSL and the memory cells MC1 to MCn. The source select transistor SST is directly connected to the common source line CSL and the memory cell MC1.

Source select transistors SSTs of cell strings arranged in the same row are coupled to the same source select line. For example, gate electrodes of source select transistors SSTs of the cell strings CS11' to CS1m' arranged in a first row are coupled to a first source select line SSL1. Gate electrodes of source select transistors SSTs of the cell strings CS21' to CS2m' arranged in a second row are coupled to a second source select line SSL2. In another embodiment, the gate electrodes of the source select transistors SSTs of the cell strings CS11' to CS1m' and CS21' to CS2m' may be coupled in common to a single source select line. That is, gate electrodes of source select transistors SSTs of cell strings in two adjacent rows are coupled to a single common source select line. In other embodiments, gate electrodes of source select transistors SSTs of cell strings in more than two adjacent rows are coupled to a single common source select line.

The first to n-th memory cells MC1 to MCn in each cell string are connected in series between the source select transistor SST and the drain select transistor DST. Gate electrodes of the first to n-th memory cells MC1 to MCn are coupled to first to n-th word lines WL1 to WLn, respectively.

The drain select transistor DST in each cell string is connected between a corresponding bit line BL and the memory cells MC1 to MCn. The drain select transistor DST is directly connected to the corresponding bit line BL and the memory cell MCn.

Drain select transistors DSTs of cell strings arranged in the row direction are coupled to drain select lines DSL extending in the row direction. For example, gate electrodes of the drain select transistors DSTs of the cell strings CS11' to CS1m' in the first row are coupled to a first drain select line DSL1. Gate electrodes of the drain select transistors of the cell strings CS21' to CS2m' in the second row are coupled to a second drain select line DSL2.

As a result, the memory block BLK1' of FIG. 4 has an equivalent circuit similar to that of the memory block BLK1 of FIG. 3, except that a pipe transistor PT is excluded from each cell string of FIG. 4 in an aspect of its configuration.

FIG. 5 illustrates a threshold voltage distribution depending on a program state of a multi-level cell.

Referring to FIG. 5, a horizontal axis, e.g., an X axis, indicates a threshold voltage Vth of memory cells and a vertical axis, e.g., a Y axis, indicates the number of memory cells corresponding to a certain threshold voltage. As illustrated in FIG. 5, in order to store 2-bit data, each memory cell has an erase state E, or any one of three program states P1, P2, and P3, depending on data stored in the memory cell. During a read operation, read voltages Vrd1, Vrd2, and Vrd3 are individually applied to a word line coupled to a selected memory cell, which is selected as a read target among cells in a memory cell string, and a read pass voltage Vrp is applied to word lines coupled to unselected memory cells among the cells in the memory cell string.

The read pass voltage Vrp is applied to the word lines coupled to the unselected memory cells, and thus all of the unselected memory cells in the memory cell string are turned on. On the other hand, when the read voltages Vrd1, Vrd2, and Vrd3 are individually applied to the word line coupled to the selected memory cell, the selected memory cell is turned on or off depending on a threshold voltage of the selected memory cell that is determined by data stored therein. By means of this operation, the erase state E, or any of the program states P1, P2, and P3 to which the threshold voltage of the selected memory cell belongs, may be identified.

Figure 6:
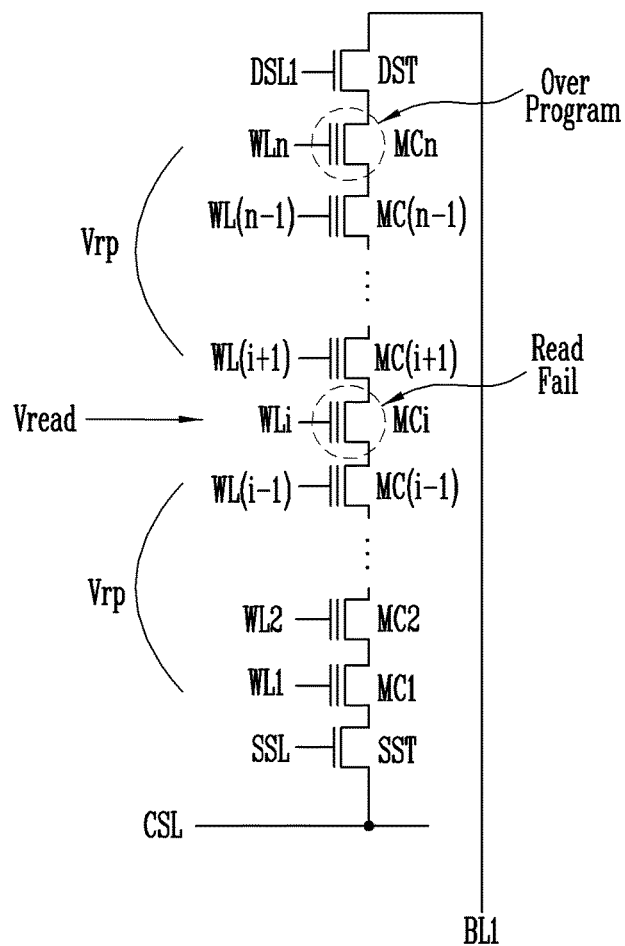
FIG. 6 describes a read failure caused by an over-programmed memory cell.
Figure 7:
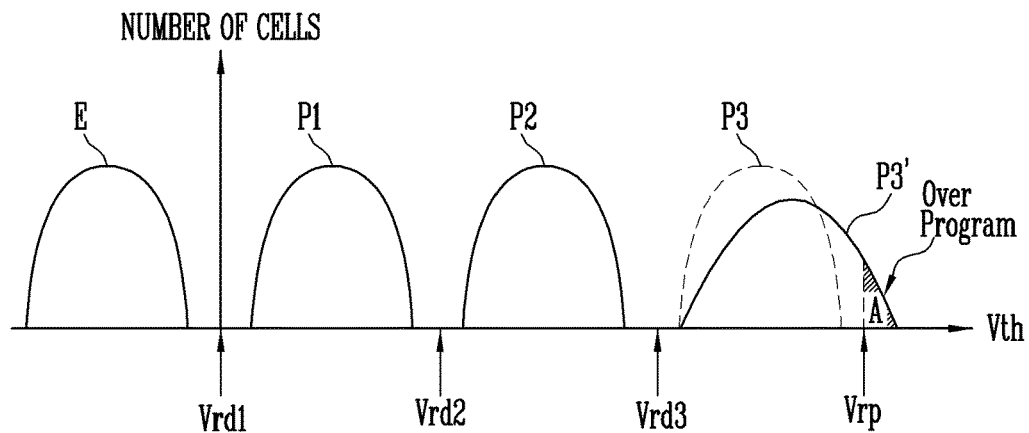
FIG. 7 illustrates a threshold voltage distribution caused by an over-programmed memory cell.

FIG. 6 describes a read failure caused by an over-programmed memory cell. FIG. 7 illustrates a threshold voltage distribution caused by an over-programmed memory cell. For convenience of description, FIG. 6 illustrates a single memory cell string in a memory block.

Referring to FIG. 6, the single memory cell string includes a source select transistor SST, first to n-th memory cells MC1 to MCn, and a drain select transistor DST, which are sequentially coupled to each other. The source select transistor SST is coupled to a common source line CSL, and the drain select transistor DST is coupled to a bit line BL1. A gate electrode of the source select transistor SST is coupled to a source select line SSL, and a gate electrode of the drain select transistor DST is coupled to a drain select line DSL1. Meanwhile, gate electrodes of the first to n-th memory cells MC1 to MCn are respectively coupled to word lines WL1 to WLn.

In order to read data from an i-th memory cell MCi that is a selected memory cell, a read voltage Vread is applied to an i-th word line WLi. In FIG. 6, the read voltage Vread may include any of read voltages Vrd1, Vrd2, and Vrd3 illustrated in FIG. 5. Meanwhile, in order to read the data from the i-th memory cell MCi, a read pass voltage Vrp is applied to the word lines WL1 to WL(i−1) and WL(i+1) to WLn respectively coupled to unselected memory cells MC1 to MC(i−1) and MC(i+1) to MCn. In typical cases, all of the unselected memory cells MC1 to MC(i−1) and MC(i+1) to MCn are turned on as the read pass voltage Vrp is applied thereto, and the selected memory cell MCi is turned on or off depending on a relationship between a threshold voltage of the memory cell MCi and the read voltage Vread.

However, as illustrated in FIG. 6, any one of the memory cells MC1 to MCn, e.g., the memory cell MCn, in the memory cell string may be over-programmed. If the memory cell MCn, which is supposed to be programmed to a third program state P3, is over-programmed due to a program disruption or the like, the memory cell MCn may be programmed to have an over-program state P3', as illustrated in FIG. 7. When some of memory cells corresponding to the third program state P3 are over-programmed, threshold voltages of the over-programmed memory cells may be changed to a hatched region A, as illustrated in FIG. 7, and thus the threshold voltages of the over-programmed memory cells may be higher than the read pass voltage Vrp.

When the n-th memory cell MCn of FIG. 6 has been over-programmed as illustrated in FIG. 7, a read failure may occur when a read operation is performed on the memory cells MC1 to MC(n−1) other than the n-th memory cell. For example, when the read operation is performed on the i-th memory cell MCi, the n-th memory cell MCn may not be turned on even if the read pass voltage Vrp is applied to the n-th word line WLn because the threshold voltage of the n-th memory cell MCn has a higher voltage level than the read pass voltage Vrp, due to the over-programming.

For example, when the threshold voltage of the selected i-th memory cell MCi corresponds to an erase state E, the unselected memory cells MC1 to MC(i−1) and MC(i+1) to MCn should be turned on and then a current path should be formed between the bit line BL1 and the common source line CSL even if any of the read voltages Vrd1, Vrd2, and Vrd3 is applied to the i-th memory cell MCi.

When the threshold voltage of the i-th memory cell MCi corresponds to the first program state P1, the i-th memory cell MCi is turned off when the read voltage Vrd1 is applied to the i-th memory cell MCi, and turned on when the read voltage Vrd2 or Vrd3 is applied to the i-th memory cell MCi.

When the threshold voltage of the i-th memory cell MCi corresponds to the second program state P2, the i-th memory cell MCi is turned off when the read voltage Vrd1 or Vrd2 is applied to the i-th memory cell MCi, and turned on when the read voltage Vrd3 is applied to the i-th memory cell MCi.

When the threshold voltage of the i-th memory cell MCi corresponds to the third program state P3, the i-th memory cell MCi is turned off even when any of the read voltages Vrd1, Vrd2, and Vrd3 is applied to the i-th memory cell MCi, and thus a current path between the bit line BL1 and the common source line CSL is blocked by the turned-off i-th memory cell MCi.

In this way, in a normal situation in which there is no over-programmed memory cell, the current path between the bit line BL1 and the common source line CSL is blocked or unblocked depending on the program state of the selected memory cell MCi, i.e., data stored in the selected memory cell MCi.

However, as illustrated in FIGS. 6 and 7, when the n-th memory cell MCn has been over-programmed, the n-th memory cell MCn is turned off when the read pass voltage Vrp is applied to the n-th memory cell MCn. That is, the current path between the bit line BL1 and the common source line CSL is blocked regardless of the data stored in the selected memory cell MCi. Therefore, the data stored in the selected memory cell MCi is read as data corresponding to the third program state P3, regardless of the data stored in the selected memory cell MCi, and thus a read failure may occur. This read failure may occur in a read operation on any of the first to (n−1)-th memory cells MC1 to MC(n−1) when the n-th memory cell MCn has been over-programmed.

In accordance with a method of operating a semiconductor memory device according to an embodiment of the present disclosure, a read pass voltage, which is to be applied to over-programmed memory cells, is stepped up, i.e., to a stepped-up read pass voltage, which has a higher level than a typical read pass voltage. The stepped-up read pass voltage is applied to the over-programmed memory cells, so as to prevent a read failure from occurring due to the one or more over-programmed memory cells. Meanwhile, data stored in a page in which an over-programmed memory cell is included may be backed up to memory cells disposed in an additional area. The additional area is different from an area in which memory cells of the page are disposed. By means of the read pass voltage step-up operation and the data back-up operation, the reliability of the semiconductor memory device may be improved.

Figure 8:
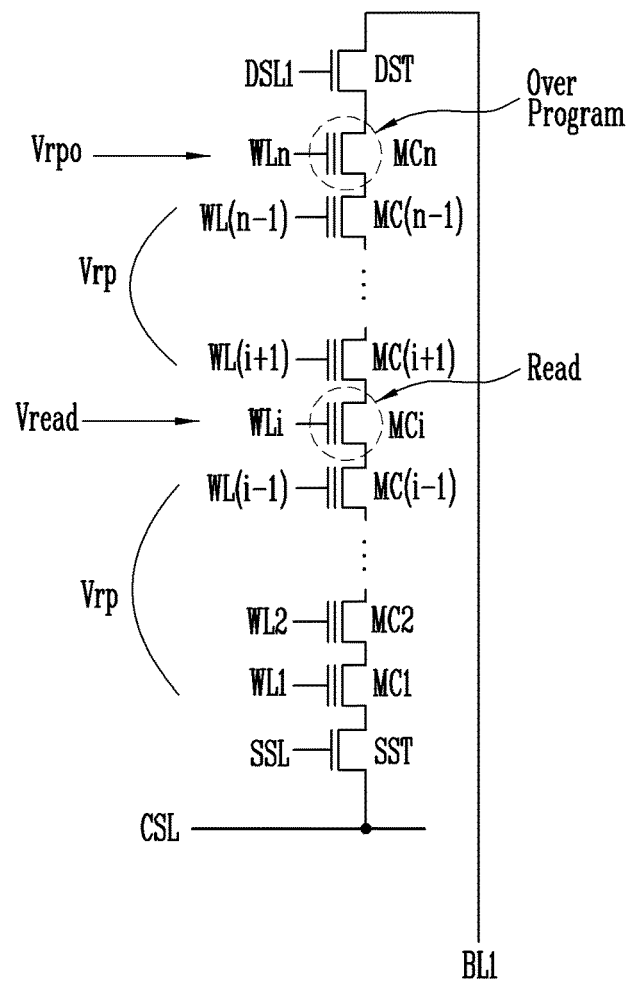
FIG. 8 describes an operation of applying a stepped-up read pass voltage to an over-programmed memory cell according to an embodiment of the present disclosure.

FIG. 8 describes an operation of applying a stepped-up read pass voltage to an over-programmed memory cell according to an embodiment of the present disclosure. FIG. 9 illustrates an effect obtained by applying a stepped-up read pass voltage to an over-programmed memory cell. Hereinafter, a method of operating a semiconductor memory device according to an embodiment of the present disclosure will be described with reference to FIGS. 8 and 9.

FIG. 8 illustrates a read operation that is performed on an i-th memory cell MCi, which is a selected memory cell. In the read operation, a read voltage Vread is applied to an i-th word line WLi. The read voltage Vread may include any of read voltages Vrd1, Vrd2, and Vrd3 illustrated in FIG. 9. Meanwhile, in order to turn on unselected memory cells MC1 to MC(i−1) and MC(i+1) to MC(n−1), a read pass voltage Vrp is applied to first to (i−1)-th word lines WL1 to WL(i−1) and (i+1)-th to (n−1)-th word lines WL(i+1) to WL(n−1), which are coupled to the unselected memory cells MC1 to MC(i−1) and MC(i+1) to MC(n−1), respectively. That is, the typical read pass voltage Vrp is applied to the remaining unselected memory cells MC1 to MC(i−1) and MC(i+1) to MC(n−1)), but is not applied to an over-programmed memory cell MCn.

In accordance with this embodiment, a "stepped-up read pass voltage Vrpo" having a higher voltage level than the typical read pass voltage Vrp is applied to a word line WLn that is coupled to the over-programmed memory cell MCn. In the present disclosure, a word line coupled to an over-programmed memory cell may be referred to as a "target word line" to be distinguished from other word lines coupled to normally programmed memory cells. As illustrated in FIG. 9, the over-programmed memory cell MCn may be turned on by applying the stepped-up read pass voltage Vrpo to the target word line WLn. Accordingly, a read failure, described above with reference to FIGS. 6 and 7, may be prevented.

FIG. 8 describes the operating method that is performed when the n-th memory cell MCn has been over-programmed. The operating method can also be applied to a case in which any one of the remaining memory cells MC1 to MC(n−1) has been over-programmed.

Meanwhile, when the stepped-up read pass voltage Vrpo is repeatedly applied to the target word line WLn, threshold voltages of the remaining memory cells coupled to the target word line WLn that are not over-programmed may be increased, because of the high voltage level of the stepped-up read pass voltage Vrpo. Thus, data stored in the remaining memory cells may be changed, and thus a read failure may be caused. Therefore, in the method of operating the semiconductor memory device according to the embodiment of the present disclosure, data stored in the memory cells coupled to the target word line WLn may be backed up to an additional memory area in the semiconductor memory device. An operating method according to an embodiment of the present disclosure, including such a back-up procedure, will be described with reference to FIGS. 10 to 12.

Figure 10:
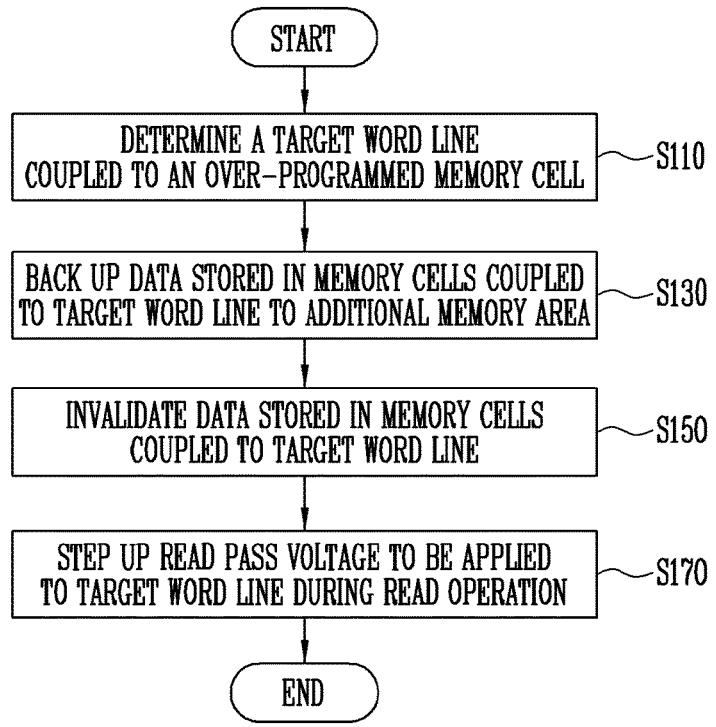
FIG. 10 is a flowchart illustrating a method of operating a semiconductor memory device according to an embodiment of the present disclosure.

FIG. 10 is a flowchart illustrating a method of operating a semiconductor memory device according to an embodiment of the present disclosure.

Referring to FIG. 10, the method of operating the semiconductor memory device may include determining a target word line coupled to an over-programmed memory cell (S110), backing up data stored in memory cells coupled to the target word line to an additional memory area (S130), and stepping up a read pass voltage (S170), which is to be applied to the target word line during a read operation. As illustrated in FIG. 10, the method may further include invalidating the data stored in the memory cells coupled to the target word line (S150).

At S110, the target word line may be determined. As described above, the target word line is a word line coupled to the over-programmed memory cell. For this purpose, a target page to which the over-programmed memory cell belongs may be detected. To detect the target page, the location of the over-programmed memory cell in a row direction should be detected to determine which row the over-programmed memory cell is located in, and the location thereof in a column direction does not need to be detected.

The location of the over-programmed memory cell in the row direction may be detected using various methods. In an embodiment, the stepped-up read pass voltage Vrpo having a higher voltage level than the read pass voltage Vrp is sequentially applied to word lines in the order of a first word line to an n-th word line while the read pass voltage Vrp is applied to the remaining word lines. As a result, a word line to which the over-programmed memory cell is coupled may be determined. This operation will be described below with reference to FIG. 6.

First, the stepped-up read pass voltage Vrpo is applied to the first word line WL1 and the read pass voltage Vrp is applied to the second to n-th word lines WL2 to WLn. At this time, since the n-th memory cell MCn has been over-programmed, when the read pass voltage Vrp is applied to the n-th word line WLn, the n-th memory cell MCn coupled to the n-th word line WLn is turned off. Accordingly, a current path is not formed between the bit line BL1 and the common source line CSL. Therefore, it can be determined that a memory cell coupled to a word line other than the first word line WL1 has been over-programmed.

Thereafter, the stepped-up read pass voltage Vrpo is applied to the second word line WL2 and the read pass voltage Vrp is applied to the first word line WL1 and the third to n-th word lines WL3 to WLn.

In this case, the n-th memory cell MCn is still turned off, and a current path is not formed between the bit line BL1 and the common source line CSL. Therefore, it can be determined that a memory cell coupled to a word line other than the first and second word lines WL1 and WL2 has been over-programmed.

In this way, this process is performed until the stepped-up read pass voltage Vrpo is applied to the n-th word line WLn and the read pass voltage Vrp is applied to the first to (n−1)-th word lines WL1 to WL(n−1). When the stepped-up read pass voltage Vrpo is applied to the n-th memory cell MCn, the n-th memory cell MCn is finally turned on, and thus a current path is formed between the bit line BL1 and the common source line CSL. Therefore, it can be determined that the memory cell MCn coupled to the n-th word line WLn has been over-programmed.

The above-described embodiment is a method that is effective when it is assumed that a single memory cell in a memory cell string has been over-programmed. Therefore, when two or more over-programmed memory cells are present in a single memory cell string, it is impossible to detect where the over-programmed memory cells are located using the above method, alone.

When it is expected that two or more over-programmed memory cells are present in a single memory cell string, the locations of the over-programmed memory cells in the memory cell string may be detected by applying the stepped-up read pass voltage Vrpo to two or more word lines and applying the read pass voltage Vrp to the remaining word lines, which are word lines other than the two or more word lines. Here, a combination of word lines to which the stepped-up read pass voltage Vrpo is applied may be determined in various manners.

In an embodiment, the stepped-up read pass voltage Vrpo may be applied to the first to k-th word lines WL1 to WLk and the read pass voltage Vrp may be applied to the (k+1)-th to n-th word lines WL(k+1) to WLn, and vice versa. As a result, if a current path is formed between the bit line BL1 and the common source line CSL when the stepped-up read pass voltage Vrpo is applied to the first to k-th word lines WL1 to WLk, it may represent that at least one memory cell, among the first to k-th memory cells respectively coupled to the first to k-th word lines WL1 to WLk, has been over-programmed, and that the (k+1)-th to n-th memory cells have not been over-programmed. After that, a scheme may be repeated for applying the stepped-up read pass voltage Vrpo to a smaller number of word lines, among the first to k-th word lines WL1 to WLk, and applying the read pass voltage Vrp to the remaining word lines of the first to k-th word lines WL1 to WLk and the k+1)-th to n-th word lines WL(k+1) to WLn. In this way, a range in which over-programmed memory cells are determined to be located may be gradually narrowed.

The above-described method is an example of methods of detecting the locations of over-programmed memory cells. Therefore, various methods differing from the above-described method may be used to detect the locations of over-programmed memory cells.

When the location of each over-programmed memory cell is detected, a word line coupled to an over-programmed memory cell is determined as the target word line. In this way, the location of an over-programmed memory cell is detected and a target word line coupled to the over-programmed memory cell is determined, at S110.

At S130, data stored in memory cells coupled to the target word line is backed up to an additional memory area. This data back-up process will be described in detail below with reference to FIGS. 11A to 11C.

Figure 11A:
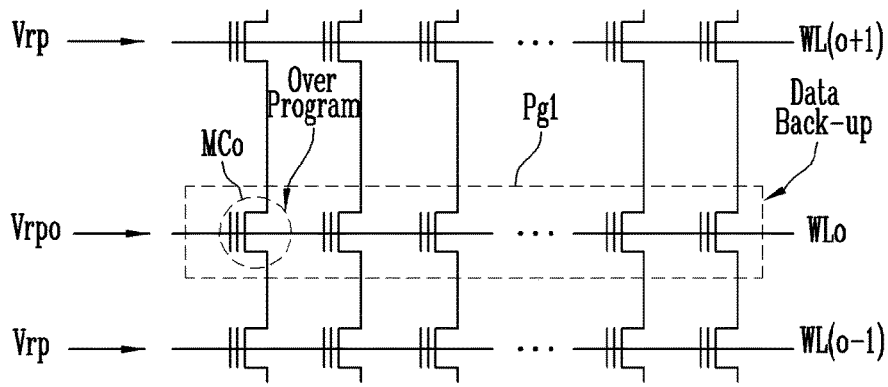
FIG. 11A illustrates backing up data stored in memory cells coupled to a target word line according to an embodiment of the present disclosure.

FIG. 11A describes the data back-up process of FIG. 10 according to an embodiment.

FIG. 11A shows that a memory cell MCo has been over-programmed and thus a word line WLo coupled to the memory cell MCo is determined as a target word line. In particular, in FIG. 11A, a portion of the memory cell array of FIG. 3 or 4, viewed in a +Y direction, is illustrated. That is, in FIG. 11A, memory cells coupled in series in a +Z direction constitute a memory string. FIG. 11A shows three pages that are respectively coupled to three different word lines WL(o−1), WLo, and WL(o+1).

Since the memory cell MCo has been over-programmed, the stepped-up read pass voltage Vrpo is applied to the target word line WLo when a read operation is performed on a selected memory cell. The selected memory cell is in the same memory cell string as the over-programmed memory cell MCo, but it is coupled to another word line (not shown) that is different from the word lines WL(o−1), WLo, and WL(o+1). At this time, the read pass voltage Vrp is applied to the remaining unselected word lines WL(o−1) and WL(o+1).

As described above, whenever a read operation is performed on another selected memory cell, the stepped-up read pass voltage Vrpo is applied to the target word line WLo. As the stepped-up read pass voltage Vrpo is repeatedly applied to the target word line WLo, threshold voltages of memory cells coupled to the target word line WLo may be gradually increased. The increase of the threshold voltages may cause a read failure when data is read from the memory cells coupled to the word line WLo.

Therefore, in accordance with an embodiment of the present disclosure, data stored in the memory cells coupled to the target word line WLo may be backed up to an additional memory area. In an embodiment, data stored in the memory cells coupled to the target word line WLo, that is, data in a page Pg1 of the target word line WLo illustrated in FIG. 11A, may be backed up to the additional memory area, e.g., an additional memory block that is different from a memory block coupled to the target word line WLo. Therefore, even if the threshold voltages of the memory cells coupled to the target word line WLo are gradually increased by repeatedly applying the stepped-up read pass voltage Vrpo to the target word line WLo, a read operation on the memory cells coupled to the target word line WLo may be performed using the backed-up data. Referring back to FIG. 1, when the read operation is performed on the data in the page Pg1 of the target word line WLo, the control logic 140 may control the peripheral circuit so that the backed-up data stored in the other memory block is read.

Figure 11B:
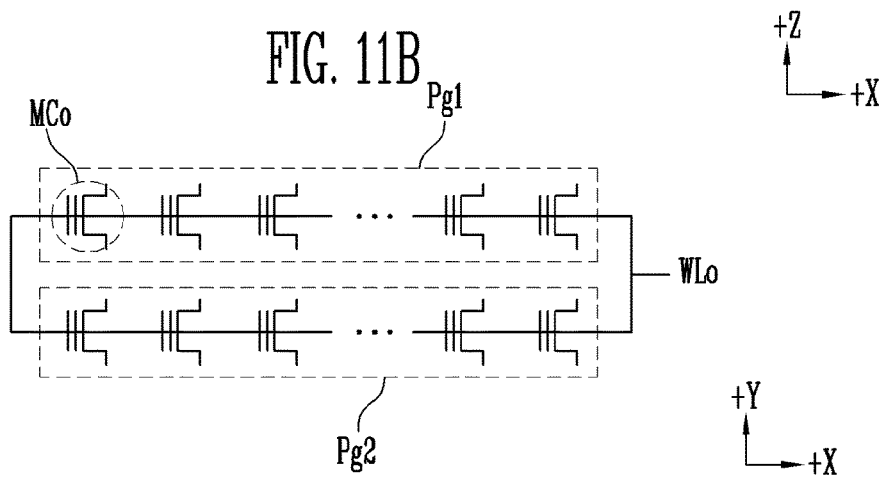
FIG. 11B illustrates backing up data stored in memory cells coupled to a target word line according to another embodiment of the present disclosure.

FIG. 11B describes the data back-up process of FIG. 10 according to another embodiment. FIG. 11B illustrates two individual physical pages coupled to the target word line WLo. FIGS. 3 and 4 each show that two physical pages arranged in the +Y direction are coupled to each word line.

Referring to FIG. 11B, a portion of the memory cell array of FIG. 3 or 4, viewed in a Z direction, is illustrated. Referring to FIG. 11B, it can be determined that two different pages Pg1 and Pg2 are coupled to the same word line WLo. That is, memory cells illustrated in FIG. 11B are coupled to the same word line WLo, but do not constitute the same page. Since a read operation and a write operation of a typical semiconductor memory device are performed on a page basis, it is meaningful to identify memory cells based on the above page configuration.

In FIG. 11B, when a memory cell MCo in the page Pg1 has been over-programmed, data in the page Pg1 including the over-programmed memory cell MCo may be backed up to an additional memory area. Thereafter, a read pass voltage, which is to be applied to the target word line WLo during a read operation, is stepped up. Meanwhile, since the page Pg2 as well as the page Pg1 is coupled to the target word line WLo, threshold voltages of memory cells in the page Pg2 may also be increased due to the step-up of the read pass voltage in the read operation. Therefore, data in the page Pg2 coupled to the target word line WLo may also be backed up together with the data in the page Pg1 including the over-programmed memory cell MCo.

Figure 11C:
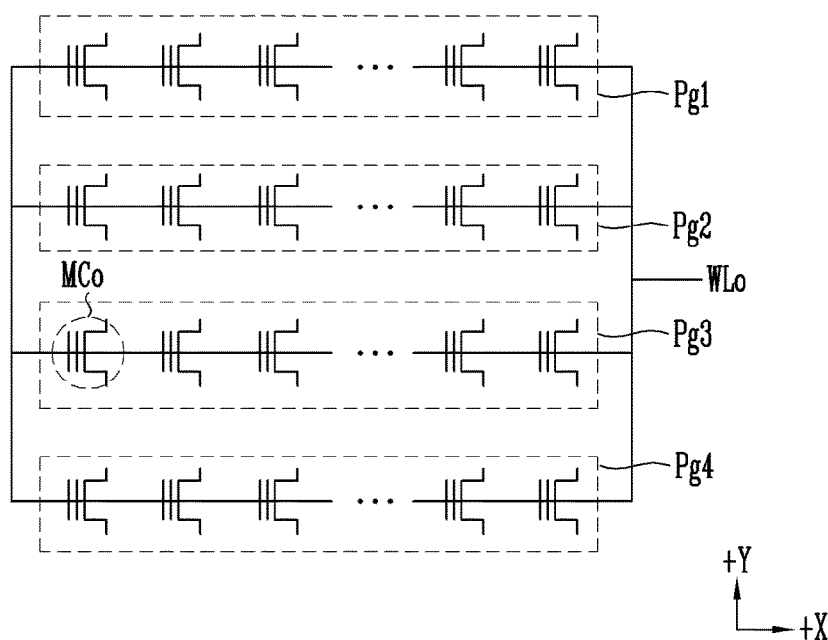
FIG. 11C illustrates backing up data stored in memory cells coupled to a target word line according to still another embodiment of the present disclosure.

FIG. 11C describes the data back-up process of FIG. 10 according to still another embodiment. FIG. 11C illustrates four individual physical pages Pg1 to Pg4 coupled to a target word line WLo. Although FIGS. 3 and 4 each illustrate that two physical pages are coupled to each word line, a memory cell array may be configured such that four physical pages are coupled to a single word line, as illustrated in FIG. 11C.

In FIG. 11C, when a memory cell MCo in a page Pg3 has been over-programmed, data in the page Pg3 including the over-programmed memory cell MCo may be backed up to an additional memory area. Thereafter, a read pass voltage, which is to be applied to the target word line WLo during a read operation, is stepped up. Meanwhile, since the additional pages Pg1, Pg2, and Pg4, as well as the page Pg3, are coupled to the target word line WLo, threshold voltages of memory cells in the pages Pg1, Pg2, and Pg4 may also be increased due to step-up of the read pass voltage in the read operation. Therefore, data in the pages Pg1, Pg2, and Pg4 coupled to the target word line WLo may also be backed up together with data in the page Pg3 including the over-programmed memory cell MCo.

Referring back to FIG. 1, step S130, i.e., the data back-up process, may be performed by the control logic 140 and the peripheral circuit. That is, the control logic 140 may control the peripheral circuit so that data in a page corresponding to the target word line WLo that is coupled to the over-programmed memory cell MCo is backed up to an additional memory area in the memory cell array 110.

Referring back to FIG. 10, at S150, data stored in the memory cells coupled to the target word line WLo is invalidated. Accordingly, when a request to read data from the memory cells coupled to the target word line WLo is received, data backed-up to the additional memory area may be read and outputted. Such invalidation may be performed by updating physical addresses corresponding to memory cells coupled to the target word line WLo with physical addresses corresponding to memory cells in the additional memory area in which the backed-up data are stored.

At S170, the read pass voltage, which is to be applied to the target word line WLo during the read operation, is stepped up. By means of the voltage step-up process, during a subsequent read operation, the stepped-up read pass voltage Vrpo is applied to the target word line WLo. Therefore, the read operation may be stably performed in spite of the presence of the over-programmed memory cell MCo.

Figure 12:
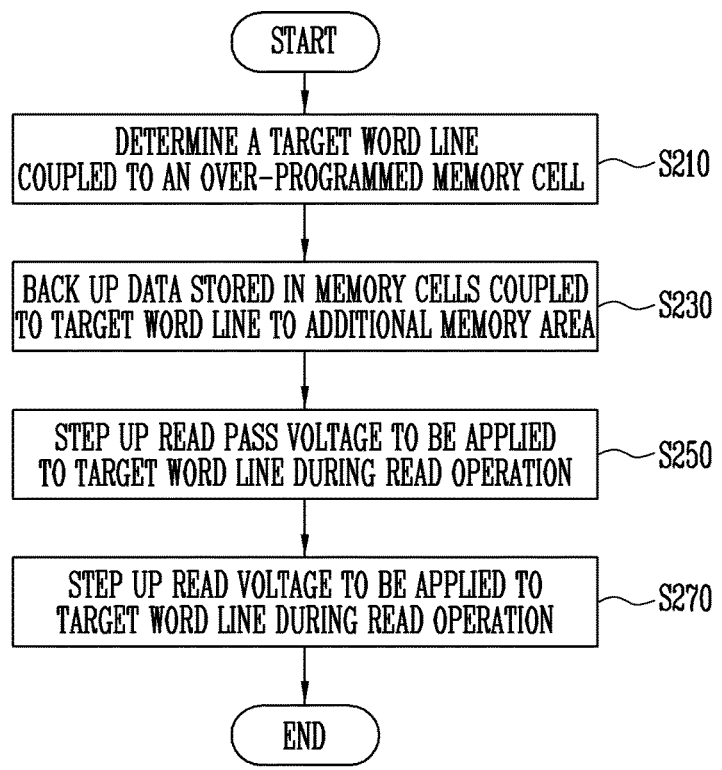
FIG. 12 is a flowchart illustrating a method of operating a semiconductor memory device according to an embodiment of the present disclosure.

FIG. 12 is a flowchart illustrating a method of operating a semiconductor memory device according to an embodiment of the present disclosure.

Referring to FIG. 12, the method of operating the semiconductor memory device may include determining a target word line coupled to an over-programmed memory cell (S210), backing up data stored in memory cells coupled to the target word line to an additional memory area (S230), stepping up a read pass voltage (S250), which is to be applied to the target word line during a read operation, and stepping up a read voltage (S270), which is to be applied to the target word line during the read operation. Since steps S210 and S230 of FIG. 12 are substantially identical to steps S110 and S130 of FIG. 10, a description thereof will be omitted. Meanwhile, step S250 of FIG. 12 is substantially identical to step S170 of FIG. 10. While the method of FIG. 10 includes step S150 of invalidating data stored in the memory cells coupled to the target word line, the method of FIG. 12 does not include such an invalidation step. Instead, the method of FIG. 12 includes step S270 of stepping up the read voltage, which is to be applied to the target word line during the read operation.

In the embodiment illustrated in FIG. 10, data invalidation (S150) is performed after the data back-up process (S130), and thus a read operation on the memory cells coupled to the target word line WLo is not performed. Instead, the backed-up data is read and output when the memory cells coupled to the target word line WLo are selected in the read operation.

In contrast, in the embodiment illustrated in FIG. 12, the data back-up process is performed at S230, and then a read operation is performed on the memory cells coupled to the target word line is performed when the memory cells coupled to the target word line are selected. In this embodiment, when the memory cells coupled to the target word line are selected in the read operation, stepping up the read voltage (S270) is performed, in order to remove the influence of repetitive application of the stepped-up read pass voltage to the memory cells coupled to the target word line.

FIG. 13 illustrates a step-up operation of a read voltage that is to be applied to a target word line according to an embodiment.

FIG. 13 illustrates a change in a threshold voltage distribution depending on repetitive application of a stepped-up read pass voltage Vrpo.

When the stepped-up read pass voltage Vrpo is repeatedly applied to the target word line WLo illustrated in any of FIGS. 11A to 11C, the threshold voltages of the memory cells coupled to the target word line WLo may be increased. Accordingly, in the memory cells coupled to the target word line WLo, a threshold voltage distribution corresponding to an erase state E may be shifted to a state E', and threshold voltage distributions corresponding to program states P1 and P2 may be shifted to states P1' and P2', respectively. As a result, a read failure may occur when data stored in the memory cells coupled to the target word line WLo are read. Therefore, as illustrated in FIG. 13, a first read voltage Vrd1, which is to be applied to the target word line WLo in the read operation, may be stepped up to a voltage Vrd1' having a higher level than the first read voltage Vrd1. Although a configuration for stepping up the first read voltage Vrd1 is illustrated in FIG. 13, a second read voltage Vrd2 and a third read voltage Vrd3 may also be stepped up if necessary. Referring back to FIG. 1, when a read operation is performed on data in a page corresponding to the target word line WLo, the control logic 140 may control the peripheral circuit so that the stepped-up read voltage Vrd1' is applied to the target word line WLo.

The read voltage, e.g., the first read voltage Vrd1, is suitably stepped up at S270 of FIG. 12, so that the read operation on the memory cells coupled to the target word line WLo may be stably performed. Therefore, the operation reliability of the semiconductor memory device may be improved.

Although not illustrated in FIG. 12, after S270, the read operation may be performed on the memory cells coupled to the target word line WLo. Thereafter, a result of the read operation is decoded. As a result of the decoding, the read operation may be determined to be successfully performed. However, since a shift width of the threshold voltage distribution illustrated in FIG. 13 may be gradually increased by the repetitive application of the stepped-up read pass voltage Vrpo, a read failure may occur again.

In this case, in accordance with an embodiment of the present disclosure, the read voltage, which is to be applied to the target word line WLo, may be additionally increased. That is, the stepped-up first read voltage Vrd1' illustrated in FIG. 13 may be further stepped up to a voltage having a higher level than the stepped-up first read voltage Vrd1'. This operation may be performed under the control of the control logic 140 of FIG. 1.

Alternatively, in accordance with an embodiment of the present disclosure, data that is backed up at S230 may be read when a read failure occurs. In this case, since the backed-up data stored in an additional memory area of the memory cell array is read, the stability of the read operation may be improved. Here, in order to read the backed-up data, data stored in the page of the target word line WLo may be invalidated. Due to the data invalidation, physical addresses corresponding to the memory cells coupled to the target word line WLo may be updated with physical addresses corresponding to memory cells in the additional memory area in which the backed-up data are stored.

As described above, in the semiconductor memory device according to embodiments of the present disclosure, a read failure may be prevented by stepping up a read pass voltage, which is to be applied to a target word line that is coupled to an over-programmed memory cell. Further, according to the embodiments of the present disclosure, since data in a page corresponding to the target word line are backed up to an additional memory area and then the backed-up data are read from the additional memory area in a read operation of the page corresponding to the target word line, it is possible to remove an influence due to a change in a threshold voltage distribution depending on the stepped-up read pass voltage. Therefore, the operation reliability of the semiconductor memory device may be improved.

Figure 14:
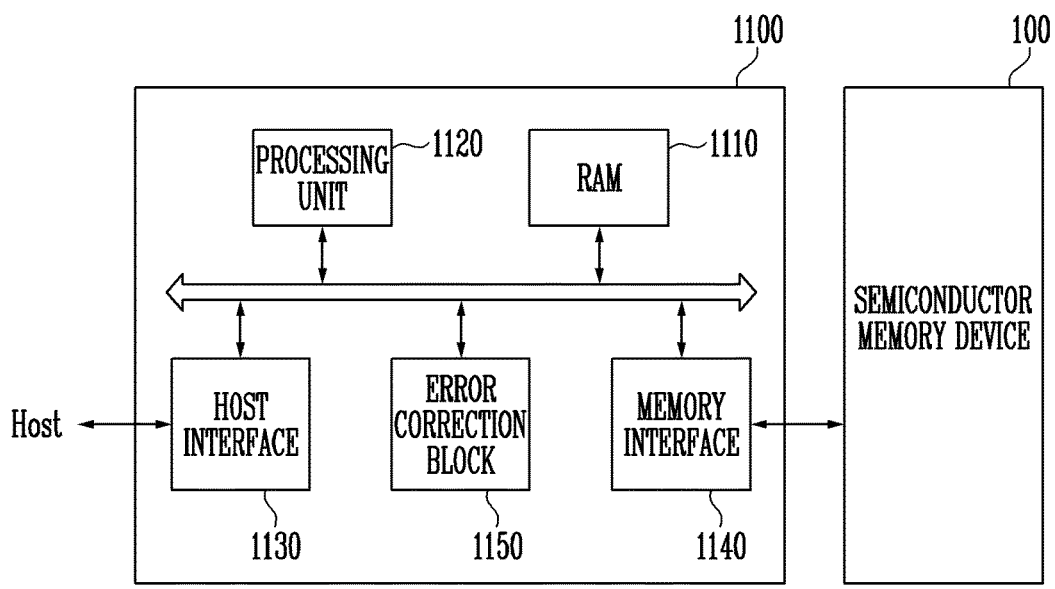
FIG. 14 is a block diagram illustrating a memory system including the semiconductor memory device of FIG. 1.

FIG. 14 is a block diagram illustrating a memory system 1000 including the semiconductor memory device 100 of FIG. 1.

Referring to FIG. 14, the memory system 1000 includes a semiconductor memory device 100 and a controller 1100. The semiconductor memory device 100 may be the semiconductor memory device described with reference to FIG. 1. Hereinafter, a description thereof will be omitted.

The controller 1100 is coupled to a host apparatus (Host) and the semiconductor memory device 100. The controller 1100 is configured to access the semiconductor memory device 100 in response to a request from the host apparatus. For example, the controller 1100 is configured to control read, write, erase, and background operations of the semiconductor memory device 100. The controller 1100 is configured to provide an interface between the host apparatus and the semiconductor memory device 100. The controller 1100 is configured to run firmware for controlling the semiconductor memory device 100.

The controller 1100 includes a random access memory (RAM) 1110, a processing unit 1120, a host interface 1130, a memory interface 1140, and an error correction block 1150. The RAM 1110 is used as at least one of an operation memory of the processing unit 1120, a cache memory between the semiconductor memory device 100 and the host apparatus, and a buffer memory between the semiconductor memory device 100 and the host apparatus. The processing unit 1120 controls the overall operation of the controller 1100. Further, the controller 1100 may temporarily store program data provided from the host apparatus during a write operation.

The host interface 1130 includes a protocol for performing data exchange between the host apparatus and the controller 1100. In an embodiment, the controller 1100 is configured to communicate with the host apparatus through at least one of various interface protocols such as a universal serial bus (USB) protocol, a multimedia card (MMC) protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, a private protocol, and so on.

The memory interface 1140 interfaces with the semiconductor memory device 100. For example, the memory interface 1140 includes a NAND interface or a NOR interface.

The error correction block 1150 uses an error correcting code (ECC) to detect and correct an error in data received from the semiconductor memory device 100. The processing unit 1120 may adjust a read voltage based on a result of the error detection by the error correction block 1150, and may control the semiconductor memory device 100 to perform a read operation again with the adjusted read voltage.

In an embodiment, the controller 1100 and the semiconductor memory device 100 may be integrated into a single semiconductor device to form a memory card. For example, the controller 1100 and the semiconductor memory device 100 may form a memory card such as a personal computer memory card international association (PCMCIA) card, a compact flash card (CF), a smart media card (SM or SMC), a memory stick, a multimedia card (MMC, RS-MMC, or MMCmicro), an SD card (SD, miniSD, microSD, or SDHC), or a universal flash storage (UFS).

In another embodiment, the controller 1100 and the semiconductor memory device 100 may be integrated into a single semiconductor device to form a solid state drive (SSD). The SSD includes a storage device configured to store data in a semiconductor memory. When the memory system 1000 is used as the SSD, an operation speed of the host apparatus coupled to the memory system 1000 may be phenomenally improved.

In an embodiment, the memory system 1000 may be provided as one of various elements of an electronic device such as a computer, a ultra mobile PC (UMPC), a workstation, a net-book, a personal digital assistants (PDA), a portable computer, a web tablet, a wireless phone, a mobile phone, a smart phone, an e-book, a portable multimedia player (PMP), a game console, a navigation device, a black box, a digital camera, a 3-dimensional television, a digital audio recorder, a digital audio player, a digital picture recorder, a digital picture player, a digital video recorder, a digital video player, a device capable of transmitting/receiving information in an wireless environment, or the like.

In another embodiment, the memory system 1000 may be provided as one of various devices for forming a home network, one of various electronic devices for forming a computer network, one of various electronic devices for forming a telematics network, an RFID device, one of various elements for forming a computing system, or the like.

In an embodiment, the semiconductor memory device 100 or the memory system 1000 may be embedded in any of various types of packages. For example, the semiconductor memory device 100 or the memory system 1000 may be embedded in Package on Package (PoP), Ball grid arrays (BGAs), Chip scale packages (CSPs), Plastic Leaded Chip Carrier (PLCC), Plastic Dual In Line Package (PDIP), Die in Waffle Pack, Die in Wafer Form, Chip On Board (COB), Ceramic Dual In Line Package (CERDIP), Plastic Metric Quad Flat Pack (MQFP), Thin Quad Flatpack (TQFP), Small Outline Integrated Circuit (SOIC), Shrink Small Outline Package (SSOP), Thin Small Outline Package (TSOP), Thin Quad Flatpack (TQFP), System In Package (SIP), Multi-Chip Package (MCP), Wafer-level Fabricated Package (WFP), or Wafer-Level Processed Stack Package (WSP).

Figure 15:
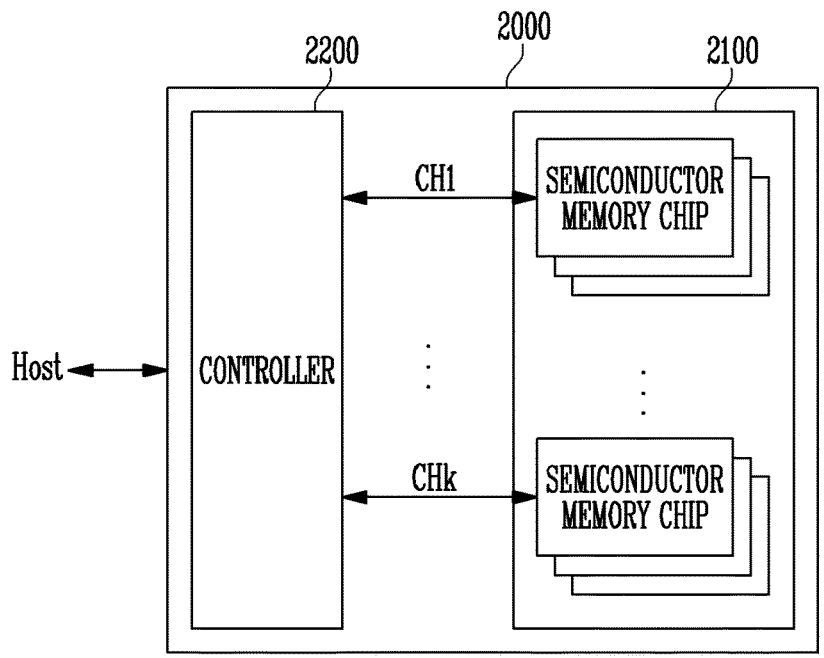
FIG. 15 is a block diagram illustrating an application of the memory system of FIG. 14.

FIG. 15 is a block diagram illustrating an application of the memory system of FIG. 14.

Referring to FIG. 15, a memory system 2000 includes a semiconductor memory device 2100 and a controller 2200. The semiconductor memory device 2100 includes a plurality of semiconductor memory chips. The semiconductor memory chips are divided into a plurality of groups.

In FIG. 15, each of the plurality of groups communicates with the controller 2200 through first to k-th channels CH1 to CHk. Each semiconductor memory chip may have the same configuration and operation as those of the semiconductor memory device 100 shown in FIG. 1.

Each of the plurality of groups communicates with the controller 2200 through one common channel. The controller 2200 has the same configuration as that of the controller 1100 shown in FIG. 14 and is configured to control the plurality of memory chips in the semiconductor memory device 2100 through the first to k-th channels CH1 to CHk.

Figure 16:
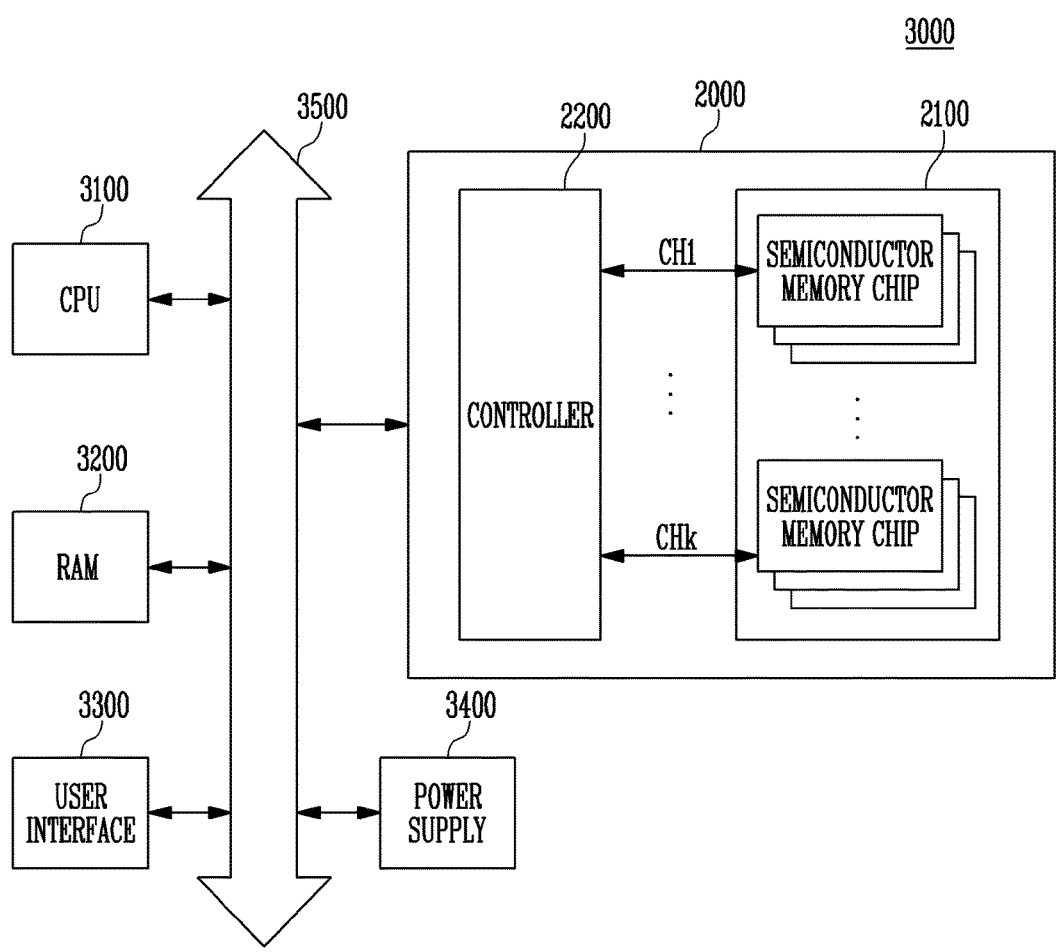
FIG. 16 is a block diagram illustrating a computing system including the memory system illustrated with reference to FIG. 15.

FIG. 16 is a block diagram illustrating a computing system 3000 including the memory system 2000 shown in FIG. 15.

The computing system 3000 may include a central processing unit (CPU) 3100, a RAM 3200, a user interface 3300, a power supply 3400, a system bus 3500, and the memory system 2000.

The memory system 2000 is electrically coupled to the CPU 3100, the RAM 3200, the user interface 3300, and the power supply 3400 through the system bus 3500. Data provided through the user interface 3300 or processed by the CPU 3100 is stored in the memory system 2000.

In FIG. 16, the semiconductor memory device 2100 is coupled to the system bus 3500 through the controller 2200. However, the semiconductor memory device 2100 may be directly coupled to the system bus 3500. In this case, the function of the controller 2200 may be performed by the CPU 3100 and the RAM 3200.

In FIG. 16, the computing system 3000 includes the memory system 2000 shown in FIG. 15. However, embodiments are not limited thereto. In another embodiment, the computing system 3000 may include the memory system 1000 shown in FIG. 14. In still another embodiment, the computing system 3000 may include both the memory systems 1000 and 2000 shown in FIGS. 14 and 15, respectively.

Furthermore, the embodiments disclosed in the present specification and the drawings aims to help those with ordinary knowledge in this art more clearly understand the present disclosure rather than aiming to limit the bounds of the present disclosure. Therefore, one of ordinary skill in the art to which the present disclosure belongs will be able to easily understand that various modifications are possible based on the technical scope of the present disclosure.

What is claimed is:

1. A method of operating a semiconductor memory device, the method comprising:
   determining a target word line coupled to an over-programmed memory cell;
   backing up data stored in memory cells coupled to the target word line in a second memory area, the second memory area being different from a first memory area where the memory cells coupled to the target word line are disposed; and
   applying a stepped-up read pass voltage to the target word line when a read operation is performed on a selected memory cell in a memory block coupled to the target word line, the selected memory cell being different from the over-programmed memory cell.

2. The method according to claim 1, wherein the stepped-up read pass voltage has a higher level than a read pass voltage, the read pass voltage being applied to an unselected memory cell in the read operation, the unselected memory cell not being over-programmed.

3. The method according to claim 1, wherein the over-programmed cell is turned on when the stepped-up read pass voltage is applied to the over-programmed cell.

4. The method according to claim 1, wherein the selected memory cell is located in a memory cell string that includes a plurality of memory cells connected in series, the plurality of memory cells being coupled to a plurality of word lines, respectively.

5. The method according to claim 1, wherein determining the target word line includes detecting the over-programmed memory cell.

6. The method according to claim 1, further comprising, after backing up the data stored in the memory cells coupled to the target word line in the second memory area, invalidating the data stored in the memory cells coupled to the target word line.

7. The method according to claim 6, wherein, when memory cells in the second memory area store the backed-up data, invalidating the data comprises updating physical addresses corresponding to the memory cells coupled to the target word line with physical addresses corresponding to the memory cells in the second memory area.

8. The method according to claim 6, wherein when the data stored in the memory cells coupled to the target word line is read, the backed-up data is read.

9. The method according to claim 1, further comprising, after backing up the data stored in the memory cells coupled to the target word line in the second memory area, stepping up a read voltage, the read voltage being applied to the target word line when the data stored in the memory cells coupled to the target word line is read.

10. The method according to claim 9, wherein when the data stored in the memory cells coupled to the target word line is read, the read operation is performed using the stepped-up read voltage, the stepped-up read voltage having a higher level than the read voltage.

11. The method according to claim 10, wherein when, as a result of the read operation on the data stored in the memory cells coupled to the target word line, a read failure occurs, the method further comprises additionally stepping up the read voltage that has been stepped up.

12. The method according to claim 10, wherein when, as a result of the read operation on the data stored in the memory cells coupled to the target word line, a read failure occurs,
the data stored in the memory cells coupled to the target word line is invalidated, and
the data backed up to the second memory area is read.

13. The method according to claim 12, wherein, when memory cells in the second memory area store the backed-up data, the data invalidation is performed by updating physical addresses corresponding to the memory cells coupled to the target word line with physical addresses corresponding to the memory cells in the second memory area.

14. The method according to claim 1, wherein the second memory area is located in a memory block that is different from the memory block to which the target word line is coupled.

15. A semiconductor memory device, comprising:
a memory cell array including a plurality of memory cells;
a peripheral circuit configured to perform a data program operation, a data read operation, and a data erase operation on the memory cell array; and
a control logic configured to control the peripheral circuit such that the data program operation, the data read operation, and the data erase operation on the memory cell array are performed,
wherein when an over-programmed memory cell is present in the memory cell array, the control logic is configured to:
back up data stored in a target page, which corresponds to a target word line to which the over-programmed memory cell is coupled, in a second memory area in the memory cell array, the second memory area being different from a first memory area where memory cells corresponding to the target page are disposed, and
control the peripheral circuit such that a stepped-up read pass voltage is applied to the target word line when a read operation is performed on a selected memory cell in a memory block coupled to the target word line, the selected memory cell being different from the over-programmed memory cell.

16. The semiconductor memory device according to claim 15, wherein the control logic is further configured to, when a read operation is performed on the data stored in the target page, control the peripheral circuit such that the backed-up data stored in the second memory area is read.

17. The semiconductor memory device according to claim 15, wherein the control logic is further configured to, when a read operation is performed on the data stored in the target page, control the peripheral circuit such that a stepped-up read voltage is applied to the target word line, the stepped-up read voltage having a higher level than a read voltage.

18. The semiconductor memory device according to claim 17, wherein the control logic is further configured to, when a read failure occurs in the data stored in the target page, control the peripheral circuit such that the stepped-up read voltage is further stepped up and then the read operation is preformed again.

19. The semiconductor memory device according to claim 17, wherein the control logic is further configured to, when a read failure occurs in the data stored in the target page, control the peripheral circuit such that the backed-up data stored in the second memory is read.

20. The semiconductor memory device according to claim 15, wherein the second memory area is located in a memory block that is different from the memory block to which the target word line is coupled.

* * * * *